(12) United States Patent  (10) Patent No.: US 9,087,903 B2
Huang et al.  (45) Date of Patent: Jul. 21, 2015

(54) BUFFER LAYER OMEGA GATE

(71) Applicant: Taiwan Semiconductor Manufacturing Company, Ltd., Hsin-Chu (TW)

(72) Inventors: Yu-Lien Huang, Jhubei (TW); Tung Ying Lee, Hsin-Chu (TW); Chung-Hsien Chen, Taipei (TW); Chi-Wen Liu, Hsin-Chu (TW)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 0 days.

(21) Appl. No.: 14/322,017

(22) Filed: Jul. 2, 2014

(65) Prior Publication Data
US 2014/0319462 A1 Oct. 30, 2014

Related U.S. Application Data

(63) Continuation-in-part of application No. 13/871,739, filed on Apr. 26, 2013, now Pat. No. 8,796,666.

(51) Int. Cl.
*H01L 29/06* (2006.01)
*H01L 29/78* (2006.01)
*H01L 29/66* (2006.01)
*H01L 29/10* (2006.01)

(52) U.S. Cl.
CPC .............. *H01L 29/785* (2013.01); *H01L 29/06* (2013.01); *H01L 29/1033* (2013.01); *H01L 29/66795* (2013.01)

(58) Field of Classification Search
CPC ............ H01L 29/66795; H01L 29/785; H01L 29/1054; H01L 29/7378
USPC ............... 257/18, 19, E29.193; 438/285, 938
See application file for complete search history.

(56) References Cited

U.S. PATENT DOCUMENTS

| 7,045,815 | B2 | 5/2006 | Yu et al. |
| 7,799,592 | B2 | 9/2010 | Lochtefeld |
| 2005/0019993 | A1* | 1/2005 | Lee et al. ...................... 438/157 |
| 2007/0001233 | A1 | 1/2007 | Schwan et al. |

FOREIGN PATENT DOCUMENTS

KR 20080024543 3/2008

* cited by examiner

*Primary Examiner* — Tu-Tu Ho
(74) *Attorney, Agent, or Firm* — Slater & Matsil, L.L.P.

(57) ABSTRACT

A device comprises insulation regions disposed in a substrate and a semiconductor fin extending above top surfaces of the insulation regions. The semiconductor fin comprises a first material. A semiconductor region comprising a second material extends from a first side of the semiconductor fin over a top of the fin to a second side of the fin. A strain buffer layer is disposed between, and contacts, the semiconductor fin and the semiconductor region. The strain buffer layer comprises an oxide, and a bottommost surface of the strain buffer layer is vertically spaced apart from the top surfaces of the insulation regions.

20 Claims, 14 Drawing Sheets

US 9,087,903 B2

BUFFER LAYER OMEGA GATE

PRIORITY CLAIM AND CROSS-REFERENCE

This application is a continuation in part of, and claims the benefit of, U.S. patent application Ser. No. 13/871,739, filed on Apr. 26, 2013, titled "MOS Devices with Strain Buffer Layer and Methods of Forming the Same," which application is incorporated herein by reference.

BACKGROUND

Reduction in the sizes and the inherent features of semiconductor devices (e.g., a Metal-Oxide-Semiconductor (MOS) device) has enabled continued improvement in speed, performance, density, and cost per unit function of integrated circuits over the past few decades.

To enhance the performance of MOS device, stress may be introduced into the channel region of a MOS transistor to improve carrier mobility. Generally, it is desirable to induce a tensile stress in the channel region of an N-type Metal-Oxide-Semiconductor (NMOS) device in a source-to-drain direction, and to induce a compressive stress in the channel region of a P-type Metal-Oxide-Semiconductor (PMOS) device in a source-to-drain direction.

In conventional methods for generating a stress in a channel region of a MOS device, a first semiconductor material is grown on a second semiconductor material through epitaxy. The first and the second semiconductor materials have different lattice constants. Hence, a stress is generated in both the first and the second semiconductor materials. A gate stack is formed over the first semiconductor material to form the MOS device. The first semiconductor material forms the channel of the MOS device, wherein the carrier mobility in the channel region is improved. Due to the lattice mismatch, however, defects also occur at the interface between the first and the second semiconductor material, which defects may include, for example, lattice misfit defects. This may result in a high leakage current.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
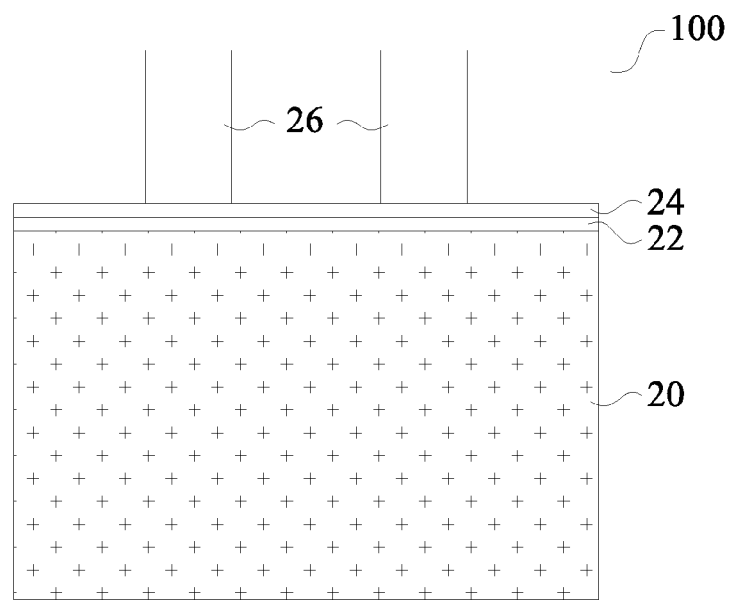
FIGS. 1 through 10B are cross-sectional views of intermediate stages in the formation of semiconductor fins and Fin Field-Effect Transistors (FinFETs) in accordance with some exemplary embodiments.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Metal-Oxide-Semiconductor (MOS) devices such as Fin Field-Effect Transistors FinFETs and methods of forming the same are provided in accordance with various exemplary embodiments. The intermediate stages of forming the FinFETs in accordance with some embodiments are illustrated. The variations of the embodiments are discussed. Throughout the various views and illustrative embodiments, like reference numbers are used to designate like elements.

Referring to FIG. 1, semiconductor substrate 20, which is a part of semiconductor wafer 100, is provided. In some embodiments, semiconductor substrate 20 includes crystalline silicon. Other commonly used materials such as carbon, germanium, gallium, boron, arsenic, nitrogen, indium, phosphorus, and/or the like, may also be included in semiconductor substrate 20. Semiconductor substrate 20 may be a bulk substrate or a Semiconductor-On-Insulator (SOI) substrate. In some exemplary embodiments, semiconductor substrate 20 comprises $Si_{1-z}Ge_z$, wherein value z is the atomic percentage of germanium in SiGe, and may be any value ranging from, and including, 0 and 1. When value z is 0, semiconductor substrate 20 is a crystalline silicon substrate. When value z is 1, semiconductor substrate 20 is a crystalline germanium substrate.

Pad layer 22 and mask layer 24 are formed on semiconductor substrate 20. Pad layer 22 may be a thin film comprising silicon oxide formed, for example, using a thermal oxidation process. Pad layer 22 may act as an adhesion layer between semiconductor substrate 20 and mask layer 24. Pad layer 22 may also act as an etch stop layer for etching mask layer 24. In some embodiments, mask layer 24 is formed of silicon nitride, for example, using Low-Pressure Chemical Vapor Deposition (LPCVD). In other embodiments, mask layer 24 is formed using thermal nitridation of silicon, Plasma Enhanced Chemical Vapor Deposition (PECVD), or the like. Mask layer 24 is used as a hard mask during subsequent photolithography processes. Photo resist 26 is formed on mask layer 24 and is then patterned.

Figure 2:
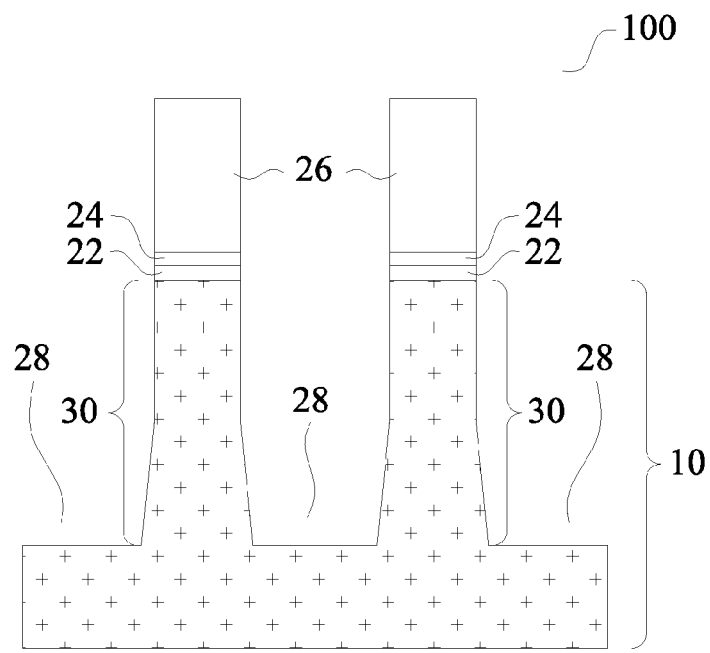

Referring to FIG. 2, mask layer 24 and pad layer 22 are etched through photo resist 26, exposing underlying semiconductor substrate 20. The exposed semiconductor substrate 20 is then etched, forming trenches 28. The portions of semiconductor substrate 20 between neighboring trenches 28 form semiconductor strips 30. Trenches 28 may include strips (when viewed in the top view of wafer 100) that are parallel to each other. After the etching of semiconductor substrate 20, photoresist 26 (FIG. 1) is removed. Next, a cleaning step may be performed to remove a native oxide of semiconductor substrate 20. The cleaning may be performed using diluted hydrofluoric (HF) acid, for example.

Figure 3:
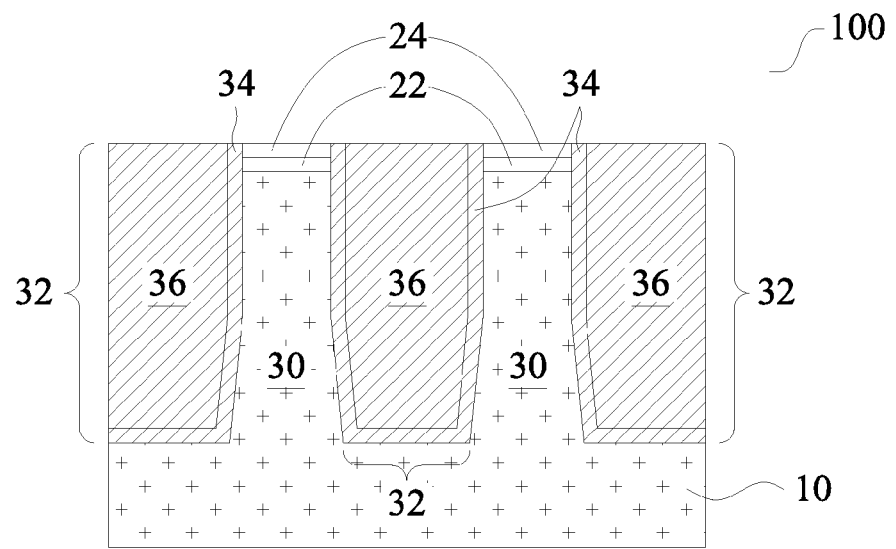

Next, trenches 28 are filled with dielectric materials to form Shallow Trench Isolation (STI) regions 32, as shown in FIG. 3. In accordance with some embodiments, the formation of STI regions 32 includes forming liner oxide 34, and then filling the remaining portions of trenches 28 with dielectric material 36, wherein liner oxide 34 and dielectric material 36 in combination form STI regions 32. Liner oxide 34 may be a conformal layer whose horizontal portions and vertical portions have thicknesses close to each other. For example, liner oxide 34 may be a thermal oxide (such as silicon dioxide) having a thickness between about 10 Å and about 40 Å. In some embodiments, liner oxide 34 is formed using In-Situ Steam Generation (ISSG), with water steam or a combined gas of hydrogen ($H_2$) and oxygen ($O_2$) used to oxidize semiconductor strips 30, The ISSG oxidation may be performed at an elevated temperature. Dielectric regions 36 may be formed, for example, using a method selected from spin-on coating, Flowable Chemical Vapor Deposition (FCVD), and the like. Dielectric region 36 may include highly-flowable materials.

An anneal step may then be performed on wafer 100. Dielectric material 36 is solidified as a result of the anneal. In some embodiments, depending on what material is comprised in dielectric regions 36 before the anneal step, and further depending on the process conditions of the anneal step, after the anneal, dielectric regions 36 mainly comprise silicon and oxygen atoms.

A planarization such as Chemical Mechanical Polish (CMP) is then performed, as shown in FIG. 3, and hence STI regions 32 are formed. STI regions 32 comprise the remaining portions of liner oxide 34 and dielectric layer 36. Mask layer 24 is used as the CMP stop layer, and hence the top surface of mask layer 24 is substantially level with the top surfaces of dielectric regions 36.

Figure 4:
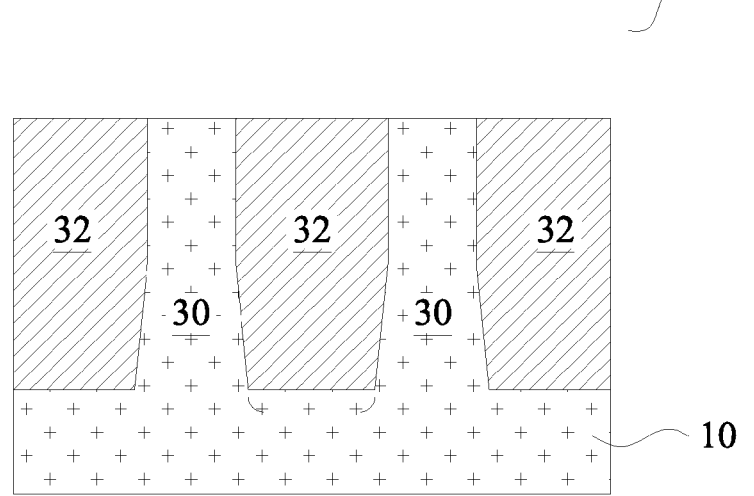
Figure 5:
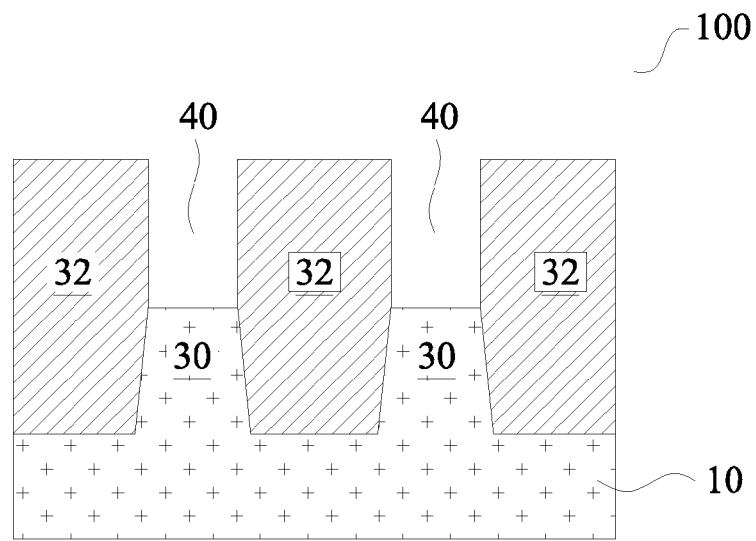

FIG. 4 illustrates the removal of mask layer 24 and pad oxide layer 22. Mask layer 24, if formed of silicon nitride, may be removed by a wet process using hot $H_3PO_4$. In some embodiments, pad oxide layer 22 is removed using diluted HF. Next, as shown in FIG. 5, semiconductor strips 30 are recessed, forming recesses 40 between neighboring STI regions 32. In some embodiments, the bottoms of recesses 40 are higher than the bottom surfaces of STI regions 32. In alternative embodiments, the bottoms of recesses 40 are substantially level with or lower than the bottom surfaces of STI regions 32. In some embodiments, the etching is performed through an isotropic etching such as wet etching, for example, using $NH_4OH$, Tetra-Methyl Ammonium Hydroxide (TMAH), a potassium hydroxide (KOH) solution, or the like, as an etchant. In some embodiments, the etching is performed through a dry etching method including, and not limited to, Inductively Coupled Plasma (ICP), Transformer Coupled Plasma (TCP), Electron Cyclotron Resonance (ECR), Reactive Ion Etch (RIE), and the like. The process gases include, for example, fluorine-containing gases (such as $CF_4$), Chlorine-containing gases (such as $Cl_2$), HBr, and/or the like.

Figure 6:
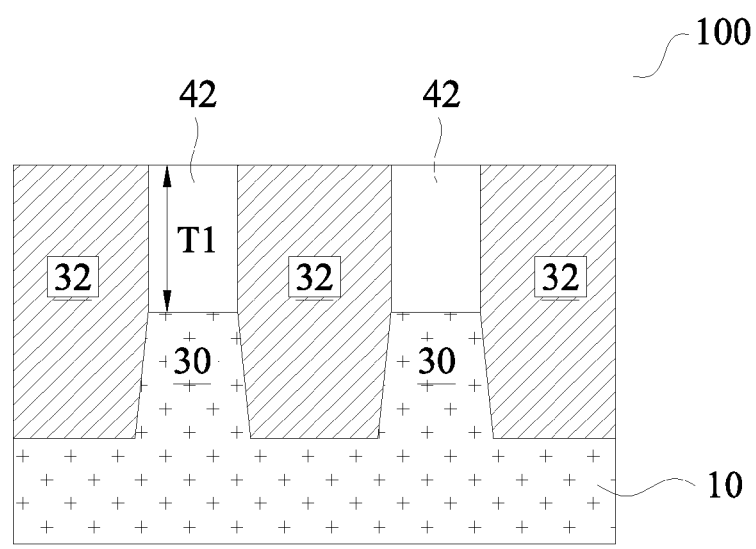

Referring to FIG. 6, semiconductor regions 42 are grown in recesses 40 (FIG. 5) through epitaxy, and the resulting semiconductor regions 42 are crystalline regions. In some embodiments, semiconductor regions 42 have a lattice constant (and a composition) different from the lattice constant (and the composition) of substrate 20. In some embodiments, semiconductor regions 42 comprise silicon germanium, which is expressed as $Si_{1-x}Ge_x$, wherein value X is the atomic percentage of germanium in semiconductor regions 42, which atomic percentage may be between about 0 (0 percent) and 1 (100 percent) in exemplary embodiments. Semiconductor regions 42 may also comprise pure germanium (when x is equal to 1) or substantially pure germanium (when x is greater than about 0.9, for example). Semiconductor regions 42 may also comprise pure silicon (when x is equal to 0) or substantially pure silicon (when x is smaller than about 0.1, for example). In these embodiments, however, the steps in FIGS. 5 and 6 may be skipped, such that semiconductor regions 42 are portions of the original substrate 10. In some embodiments, semiconductor regions 42 are relaxed semiconductor regions, and at least the top portions of semiconductor regions 42 are relaxed with substantially no internal stress. This may be achieved by, for example, making thickness T1 of semiconductor regions 42 to be great enough. Since the stresses in upper portions of semiconductor regions 42 are increasingly smaller than the lower portions, with an adequately high thickness T1, the top portions of semiconductor regions 42 are relaxed. In some exemplary embodiments, thickness T1 is greater than about 30 nm.

In some embodiments semiconductor regions 42 may be grown to a level higher than the top surfaces of STI regions 32. A CMP is then performed to level the top surface of STI regions 32 and semiconductor regions 42. The resulting structure is shown in FIG. 6. In alternative embodiments, the growth of semiconductor regions 42 stops at a time when the top surfaces of semiconductor regions 42 are level with or lower than the top surfaces of STI regions 32. In these embodiments, the CMP may be performed, or may be skipped.

Figure 7:
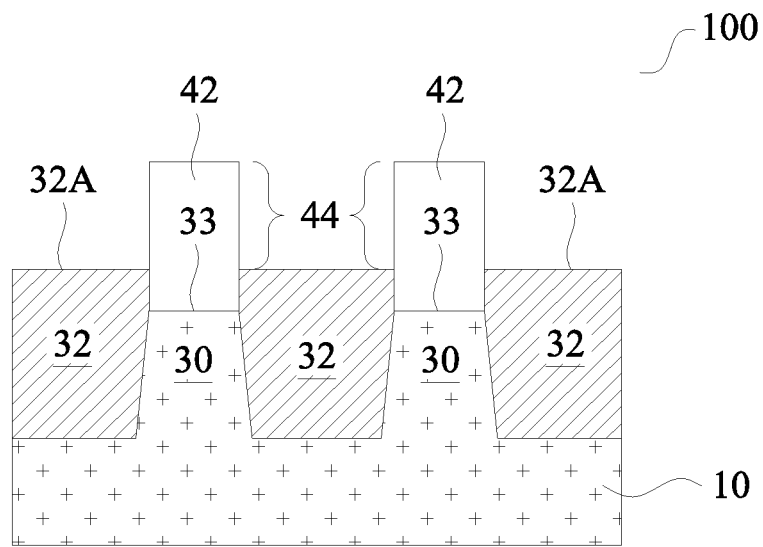

Referring to FIG. 7, STI regions 32 are recessed, for example, through an etching step, wherein diluted HF, SiCoNi (including $NF_3$ and $NH_3$), CERTAS (including $NF_3$ and $NH_3$), or the like, may be used as the etchant. The top surfaces 32A of the remaining STI regions 32 may be higher than the interfaces 33 between semiconductor regions 42 and semiconductor strips 30. The portions of semiconductor regions 42 that are higher than top surfaces 32A are referred to as semiconductor fins 44 hereinafter.

Figure 8:
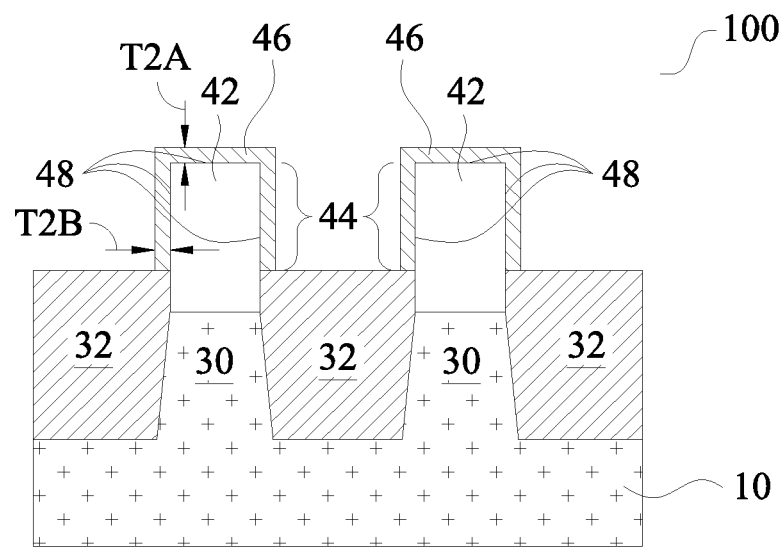

FIG. 8 illustrates the formation of semiconductor regions 46, which are epitaxially grown on the exposed top surfaces and sidewalls of semiconductor fins 44. Semiconductor regions 46 hence are crystalline semiconductor regions. Semiconductor regions 46 may be substantially conformal layers, with the portions on the top surfaces of semiconductor fins 44 having thickness T2A close to the thickness T2B of the portions on the sidewalls of semiconductor fins 44. In some embodiments, each of thicknesses T2A and T2B is between about 1 nm and about 30 nm.

In some embodiments, semiconductor regions 46 comprise $Si_{1-y}Ge_y$, wherein value Y is the atomic percentage of silicon in semiconductor regions 46. Value Y may be any value between, and including, 0 and 1. Value Y may be equal to 1, which means that semiconductor regions 46 are pure germanium regions free from silicon. Value Y may also be equal to 0, which means that semiconductor regions 46 are pure silicon regions free from germanium.

In accordance with some embodiments. The materials of semiconductor regions 42 and 46 are different from each other, and the lattice constants of semiconductor regions 42 and 46 are different from each other, so that stresses are generated in semiconductor regions 42 and 46. At interface 48 between semiconductor regions 42 and 46 and the regions nearby (also referred to as interface regions 48), there are also stresses generated due to the lattice mismatch. The difference between values X and Y may also be greater than about 0.3. In accordance with various embodiments, value X may be greater than or smaller than value Y.

In some embodiments in which the FinFET formed on fins 44 is an N-type FinFET, value Y is smaller than value X, so that a tensile stress is generated in the channel of the resulting N-type FinFET. The lattice constant of semiconductor regions 46 is thus smaller than the lattice constant of semiconductor fins 44. For example, semiconductor regions 46 may be pure silicon regions, substantially pure silicon (for example, with Y<0.1) regions, or SiGe regions, and semiconductor fins 44 may be SiGe regions or pure or substantially pure (with X>0.9) germanium regions.

In alternative embodiments in which the FinFET formed on fins 44 is a P-type FinFET, value Y is greater than value X, so that a compressive stress is generated in the channel of the resulting P-type FinFET. The lattice constant of semiconductor regions 46 is thus greater than the lattice constant of semiconductor fins 44. For example, semiconductor fins 44 may be SiGe regions or pure silicon or substantially pure silicon (for example, with X<0.1) regions, and semiconductor regions 46 may be SiGe regions or pure or substantially pure (with Y>0.9) germanium regions.

Figure 9A:
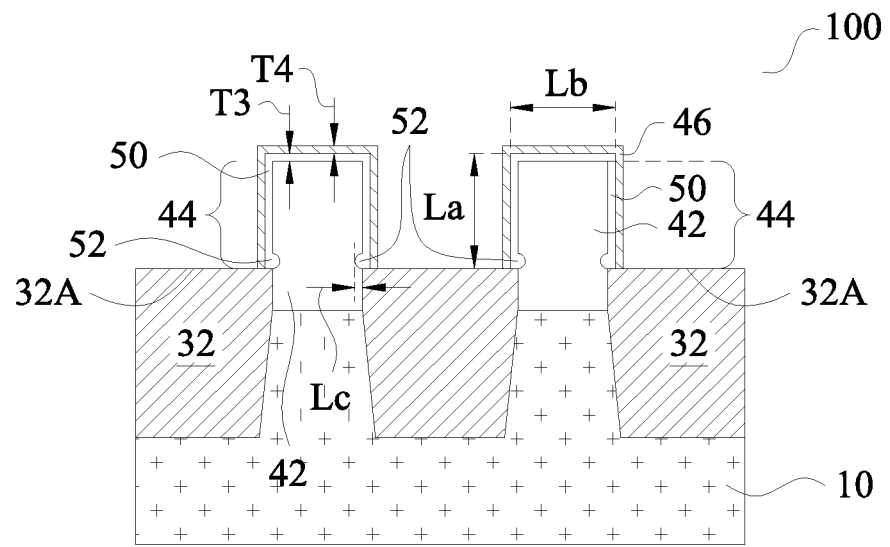

FIG. 9A illustrates the oxidation process to form strain buffer layer 50. The oxidation is performed by exposing wafer 100 in an oxygen-containing environment. In some embodiments, the oxidation comprises a plasma oxidation using an oxygen-containing gas (such as $O_2$) as a process gas. The plasma oxidation may be performed using a production tool that is used for dry etch, except that instead of using an etchant gas, the oxygen-containing gas is used, and hence the plasma oxidation rather than the etching is performed. The available tools include, and are not limited to, the tools for Inductively Coupled Plasma (ICP), the tools for Transformer Coupled Plasma (TCP), the tools for Electron Cyclotron Resonance (ECR), and the like. In an exemplary plasma oxidation process, in the chamber for the plasma oxidation, the $O_2$ has a pressure of between about 5 mTorr and about 200 mTorr, and the flow rate of $O_2$ may be between about 50 sccm and about 400 sccm. The RF power may be between about 400 watts and about 800 watts, and the DC bias may be between about 0V and about 60V.

In alternative embodiments, the plasma oxidation is performed using downstream plasma. In an exemplary plasma oxidation process, in the chamber for the downstream plasma, $O_2$ has a pressure of between about 500 mTorr and about 2,000 mTorr, and the flow rate of $O_2$ is between about 1,000 sccm and about 4,000 sccm. The process gas may further comprise a forming gas, which includes hydrogen ($H_2$) and nitrogen ($N_2$), with $H_2$ having a flow rat percentage of about 2 percent and about 10 percent in the forming gas. The RF power may be between about 1,000 watts and about 3,000 watts, and the DC bias may be about 0V.

In yet other embodiments, the oxidation process is performed using a high-temperature anneal. In accordance with some embodiments, the high-temperature anneal includes a spike anneal, which is performed in an oxygen-containing environment (for example, containing $O_2$). The annealing temperature may be between about 800° C. and about 1,300° C. The annealing time may be between about 1 second and about 10 seconds.

In accordance with alternative embodiments, the high-temperature anneal includes a soak anneal process by soaking wafer 100 in an oxygen-containing environment (for example, containing $O_2$). The annealing temperature may be between about 800° C. and about 1,200° C. The annealing time may be greater than about 30 seconds.

In accordance with yet alternative embodiments, the high-temperature anneal includes a furnace anneal by exposing wafer 100 in an oxygen-containing environment (for example, containing $O_2$ or steam). The annealing temperature may be between about 450° C. and about 1,200° C. The annealing time may be about one hour or longer.

As a result of the oxidation, strain buffer layers 50 are generated at interface 48 (FIG. 8), and extend into the nearby portions of semiconductor regions 42 and 46. In the meantime, the inner portions of semiconductor fins 44 and the outer portions of semiconductor regions 46 are not oxidized, and remain after the oxidation. In accordance with some embodiments, to form strain buffer layer 50 between semiconductor regions 42 and 46, rather than oxidizing outer portions of semiconductor regions 46 and expand the oxide regions in an inward direction, the oxidation process conditions and the strain in semiconductor regions 42 and 46 are adjusted. It was found that a high strain may help start oxidation from interface 48, rather than from the outer surface layers of semiconductor regions 46. Hence, an adequately high strain needs to be generated at interfaces 48 (FIG. 8), wherein the stress difference between regions 42 and 46 may be greater than about 500 MPa. Furthermore, the process conditions are also controlled so that oxygen may penetrate through interface 48 (FIG. 8) to oxidize the interface regions 48 first. The optimum process conditions are related to various factors including the strain level, the compositions of semiconductor regions 42 and 46, and the oxidation method. The optimum process conditions may be found through experiments.

FIG. 9A illustrates an exemplary resulting structure. In some embodiments, strain buffer layers 50 extend along interfaces 48 (FIG. 8), and are formed on the top surface and opposite sidewalls of semiconductor fins 44. Strain buffer layers 50 may fully separate semiconductor fins 44 from the overlying semiconductor regions 46 electrically and physically. In some embodiments, strain buffer layers 50 comprise silicon oxide, germanium oxide, or combinations thereof. As a result of the oxidation, notches 52 may be formed to extend into semiconductor fins 44, wherein notches 52 are substantially level with the top surface 32A of STI regions 32. Strain buffer layers 50 extend along interfaces 48 much further than toward the centers of fins 44. For example, assuming the sidewall portions of strain buffer layers 50 have length La, and the top portions of strain buffer layers have length Lb, then value (2La+Lb) is greater than depth Lc of notches 52. Thickness T3 of strain buffer layers 50 may be between about 1 nm and about 30 nm. Thickness T4 of the remaining portions of semiconductor regions 46 may be between about 1 nm and about 30 nm in some embodiments.

Figure 9B:
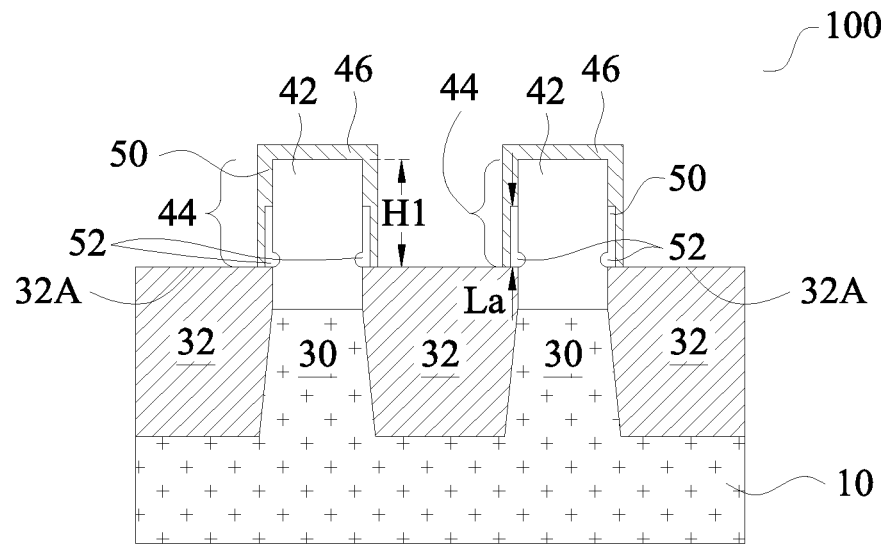
Figure 9C:
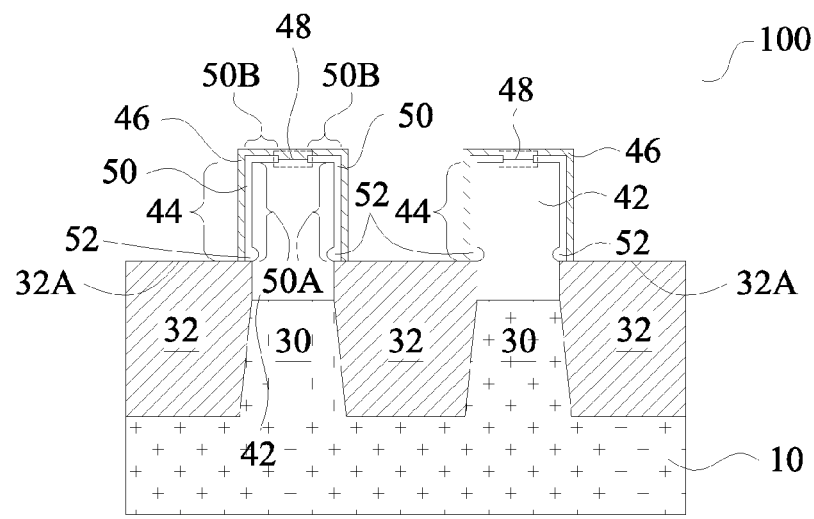

FIGS. 9B and 9C illustrate alternative embodiments in which semiconductor regions 42 and 46 are partially separated from each other by strain buffer layer 50. FIG. 9B illustrates a cross-sectional view of wafer 100 in accordance with alternative embodiments. In these embodiments, strain buffer layers 50 extend from where semiconductor regions 46 contact top surfaces 32A of STI regions 32, and extend upwardly. Strain buffer layers 50 are thus generated along interfaces 48, are formed on the opposite sides of the bottom portions the respective semiconductor fins 44. No strain buffer layers 50 are formed over semiconductor fins 44, and no strain buffer layers 50 are formed on opposite sides of the top portions of semiconductor fins 44. In some embodiments, length La of each of the sidewall portions of strain buffer layers 50 is greater than about 25 percent, greater than 50 percent, or greater than about 75 percent, of height H1 of semiconductor fins 44.

FIG. 9C illustrates a cross-sectional view of wafer 100 in accordance with yet alternative embodiments. In these embodiments, strain buffer layers 50 are formed on the opposite sides of semiconductor fins 44, and separate the entireties of sidewall surfaces of semiconductor fins 44 from the sidewall portions of semiconductor regions 46. Strain buffer layer portions 50B also extend overlying, and overlapping, portions semiconductor fins 44. The portions 50B of strain buffer layers 50 over a same one of semiconductor fins 44, however, are separated by the un-oxidized interface regions 48.

Figure 10A:
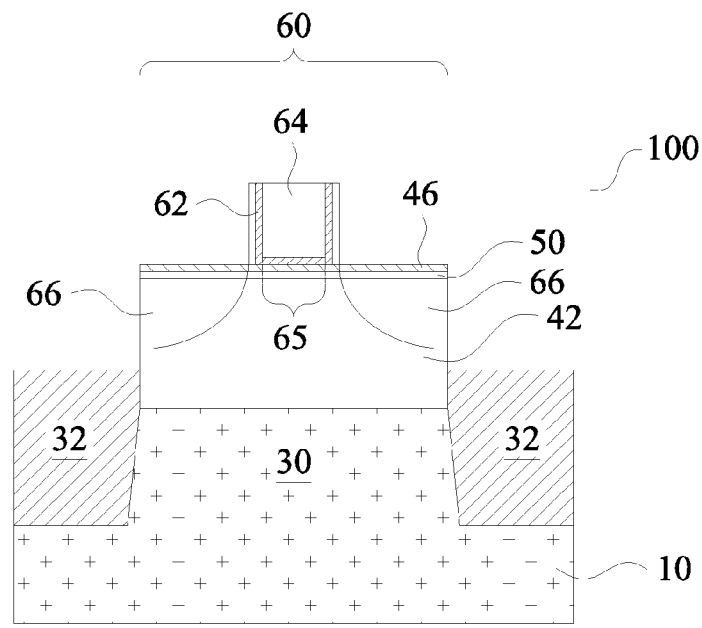
Figure 10B:
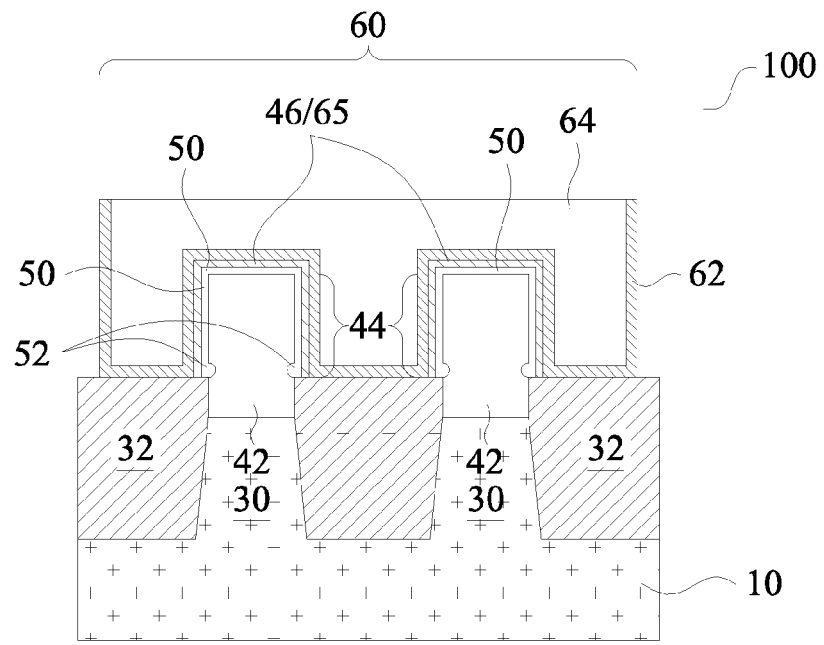

The structure shown in FIGS. 9A, 9B, and 9C may be used to form FinFET 60, as shown in FIGS. 10A and 10B. Referring to FIGS. 10A and 10B, gate dielectric 62 and gate electrode 64 are formed. Gate dielectric 62 may be formed of a dielectric material such as silicon oxide, silicon nitride, an oxynitride, multi-layers thereof, and/or combinations thereof. Gate dielectric 62 may also be formed of high-k dielectric materials. The exemplary high-k materials may have k values greater than about 4.0, or greater than about 7.0. Gate electrode 64 may be formed of doped polysilicon, metals, metal nitrides, metal silicides, and the like. After the formation of gate dielectric 62 and gate electrode 64, source and drain regions 66 are formed (see FIG. 10A).

As shown in FIG. 10A, channel region 65 is formed in semiconductor regions 46 between source and drain regions, and may comprise sidewall portions and top portions of semiconductor regions 46 (FIG. 10B). Channel regions 65 may be separated from the underlying semiconductor fins 44 fully or partially by strain buffer layers 50. FIG. 10B illustrates a cross-sectional view of FinFET 60, wherein the cross-sectional view is obtained from the plane crossing 10B-10B in FIG. 10A. FIG. 10B illustrates that gate dielectric 62 and gate electrode 64 comprise sidewall portions on the opposite sides of each of semiconductor fins 44 and top portions overlapping top surface of semiconductor fins 44.

FIGS. 10A and 10B illustrate the embodiments in which FinFET 60 is formed using a gate-last approach. In alternative embodiments, FinFET 60 may be formed using a gate-first approach. The resulting FinFET 60 has a structure similar to what is shown in FIGS. 10A and 10B, except that gate dielectric 62 will not extend on the sidewalls of the respective gate electrode 64.

Figure 11:
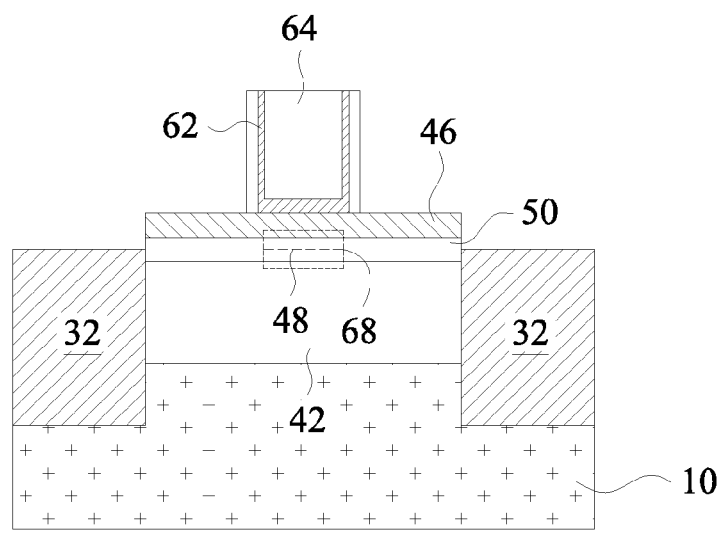
FIG. 11 illustrates a cross-sectional view of a planar transistor in accordance with alternative embodiments.

Although the formation of a FinFET is used as an example to explain the concept of the present disclosure, the concept may also be used to form a planar MOS transistor, as shown in FIG. 11. In which embodiments, a planar semiconductor layer 46 is formed on a top surface of semiconductor layer 42, wherein semiconductor layer 46 and semiconductor layer 42 are formed of essentially the same materials (by using the same methods) as semiconductor regions 46 and 42, respectively, in FIG. 8. An oxidation process is performed using essentially the same process as shown in FIGS. 9A, 9B, and 9C, and a planar strain buffer layer 50 will be formed between semiconductor layers 42 and 46. In some embodiments, semiconductor regions 46 and 42 are fully separated from each other by strain buffer layer 50. In alternative embodiments, after the oxidation, the portions of semiconductor regions 46 and 42 in interface contact region 68 are not oxidized, and are in contact with each other.

In accordance with the embodiments of the present disclosure, the interface regions (FIG. 8) of semiconductor regions that have mismatched lattice constants, which interface regions are more prone to defects such as lattice misfit defects, are oxidized to form strain buffer layers. The defects are hence eliminated in the oxidation. In addition, the oxide regions may fully separate the channel regions from the underlying semiconductor layers. Hence, the leakage currents are reduced.

Figure 12:
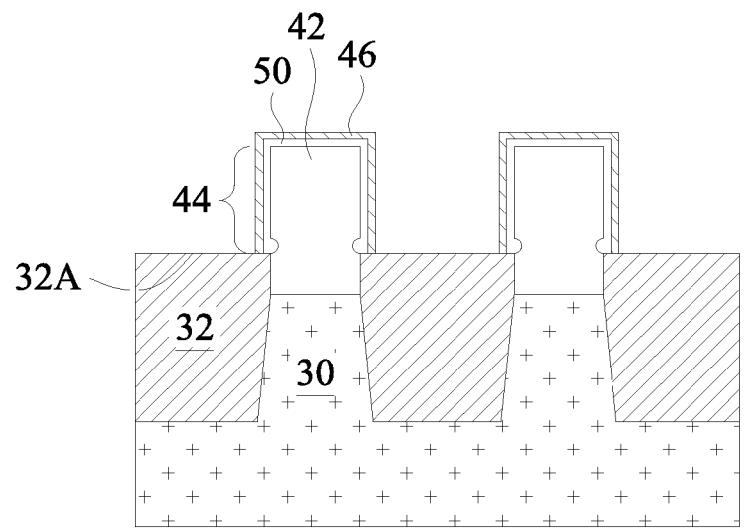
FIGS. 12 through 14 are cross-sectional views of intermediate stages in the formation of FinFETs with raised strain buffer layers in accordance with some embodiments.
Figure 13:
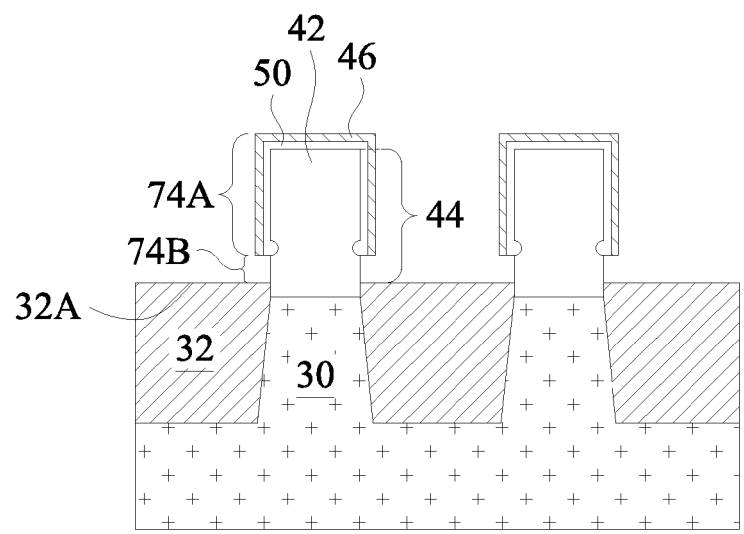
Figure 14:
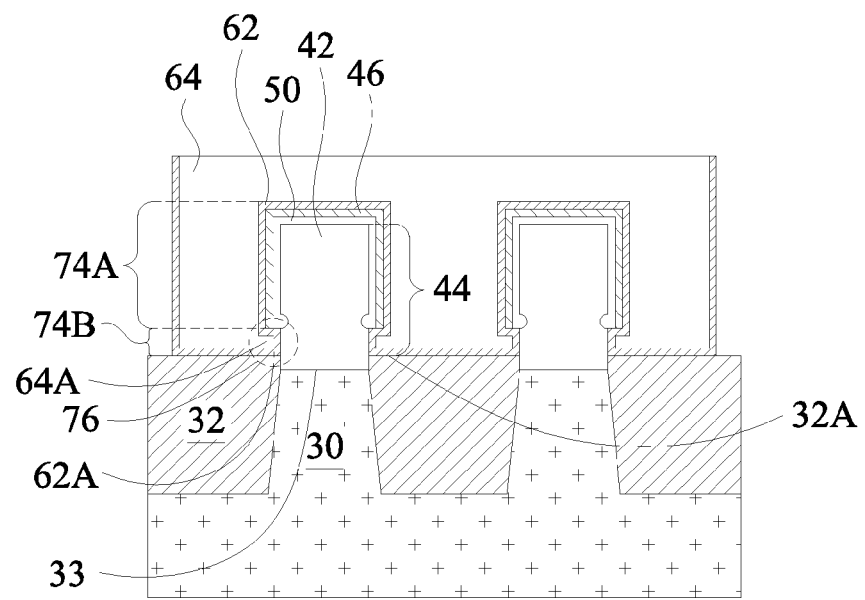

FIGS. 12 through 14 are cross-sectional views illustrating intermediate process steps for forming a FinFET with a raised strain buffer layer 50. The raised strain buffer layer 50 permits channels in both the fins and the semiconductor region 46 to be controlled by single gate. Raising the strain buffer layer 50 above the STI regions 32 creates a recess under the semiconductor region 46 where the gate stack contacts the fin.

Referring initially to FIG. 12, a fin comprising semiconductor region 42 with a strain buffer layer 50 are illustrated. The initial structure for forming a raised strained buffer layer 50 is similar to that shown above with respect to FIG. 9A. Semiconductor region 42 and semiconductor regions 46 are formed over semiconductor strips 30 as described above. The strain buffer layer 50 is formed by oxidation at the interface between the semiconductor region 42 and semiconductor region 46 as described above. The strain buffer layer 50 extends to the top surface 32A of the STI regions 32.

FIG. 13 is a cross-sectional view illustrating recessing the STI regions 30 according to an embodiment. The top surfaces 32A of the STI regions 32 are recessed a second time after recessing the STI regions 32 to expose the semiconductor regions 42 and form the fins 44. The STI regions 32 are etched back or recessed using a process as described above with respect to FIG. 7 for recessing the STI regions 32 and forming the fins 44. For example, the STI regions are etched back by diluted HF etching, SiCoNi etching, CERTAS etching, dry chemical etching, or the like. The top surface 32A of the STI regions 32 is etched back to expose a lower channel 74B in the fin 44 below the upper channel 74A formed by semiconductor region 46. In some embodiments, the height of the lower channel 74B is greater than about 2 nm and is about equal to, or less than, the height of the upper channel 74A. It has been discovered that such a height for the lower channel 74B permits tuning of the overall device and control of the lower channel 74B in the fin 44, while providing a separate channel in the semiconductor region 46. It should be noted that recessing the STI surface 32A according to the embodiments exposes a surface of the fin 44 below the semiconductor region 46 and the strain buffer layer 50. Thus, in some embodiments, the lower channel 74B has a different strain from, and is a different channel than, the upper channel 74A.

FIG. 14 is a cross-sectional view illustrating formation of a gate stack over the fins 44 according to an embodiment. A gate dielectric 62 and gate electrode 64 are formed over the fins 44 according to, for example, the methods described above with respect to FIGS. 10A and 10B. In some embodiments, the gate dielectric 62 and gate electrode 64 have a lower gate dielectric portion 62A and a lower gate electrode portion 64A, respectively, that are disposed in the lower channel gate region 76. In some embodiments, the lower gate dielectric portion 62A and lower gate electrode portion 64A extend between the lower surface of semiconductor region 46 and the top surface 32A of the STI regions 32, and control the lower channel 74A in the fin 44.

Semiconductor region 46 and semiconductor region 42 of the fin 44 share a common source and drain 66. Thus, the upper channel 74A and lower channel 74B are separate channels, but form a single FinFET, with both the upper channel 74A and lower channel 74B between the common source and drain 66 (see FIG. 10A) and controlled by a single gate electrode 64.

Providing an upper channel 74A separate from the lower channel 74B permits the use of different materials, with different strains, in the different channels. Thus, transistor performance can be tuned, for example, so that the combination of channels provides improved low current operation and high voltage performance. For example, in an embodiment, the semiconductor region 46 is formed form a material with a high mobility, such as SiGe or germanium, and the fin 44 is formed from a material, such as silicon, with a lower potential for an interface trapped charge. In other examples, a III-V semiconductor material can be used for either the semiconductor region 46 or the fin 44, with the other of the semiconductor region 46 or fin 44 being a different or non-III-V semiconductor material. In yet another example, the semiconductor region 46 and fin 44 are each formed from silicon, silicon-germanium ($Si_xGe_y$), germanium (Ge), indium gallium arsenide ($In_aGa_bAs_c$) or another material, with the semiconductor region 46 and fin 44 being formed from different materials or having different material compositions. The ratio of the height of the upper channel 74A to the height of the lower channel 74B is used to control the performance characteristics of the FinFET. It has been discovered that a ratio or at least 1:1, where the height of the upper channel 74A is about equal to, or greater than, the height of the lower channel 74B provides fast transistor performance with a reduced power consumption.

Figure 15A:
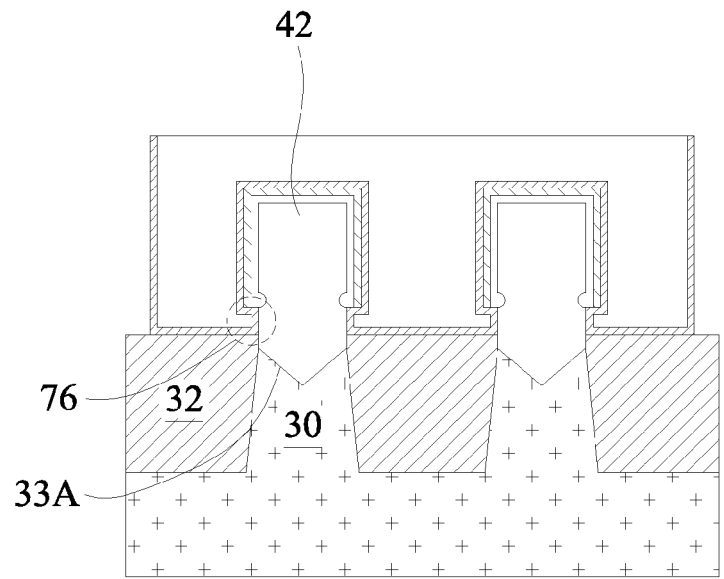
FIGS. 15A through 15C are cross-sectional views of FinFETs with raised strain buffer layers in accordance with alternative embodiments.

FIG. 15A is a cross-sectional view illustrating a FinFET with a fin interface 33A formed according to an alternative embodiment. In some embodiments, the fins 44 are formed over the semiconductor strips 30 with a non-flat interface. When the fins 44 are formed on the top surface of the semiconductor strips 30, a fin interface 33A is created with the top surface of the semiconductor strip 30, and the method of removing the top portions of the semiconductor strips 30 and post processing steps determines the shape of the fin interface 33A. For example, where the semiconductor strips 30 are etched back from the STI regions 32, the top surface of the semiconductor strips 30 has a shape that is dictated by the etch chemistry and semiconductor strip material, resulting in an upright or inverted V shape surface, a concave or convex curved surface, or another surface shape. A dry etch tends to form a flat top surface on the semiconductor strips, while wet etching tends to form an upright V shape, as shown in FIG. 15A. Similarly, a post-thermal process such as annealing or the like tends to form a convex or concave shape due to reflow effect.

Figure 15B:
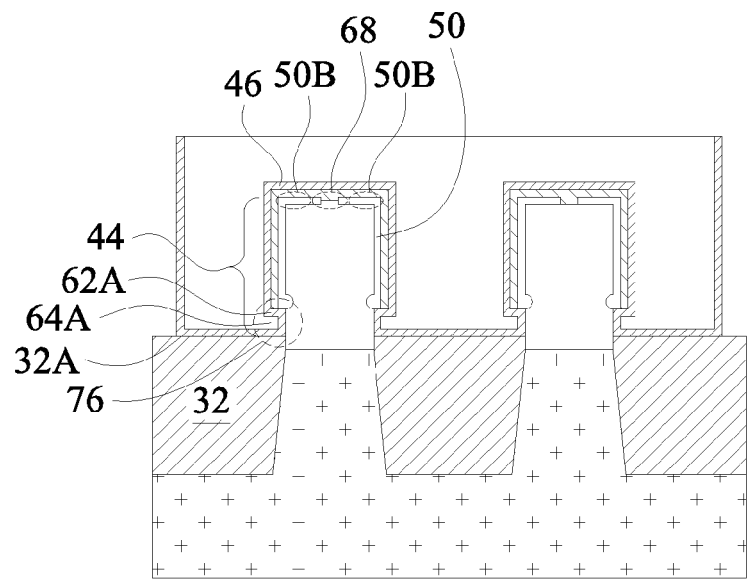
Figure 15C:
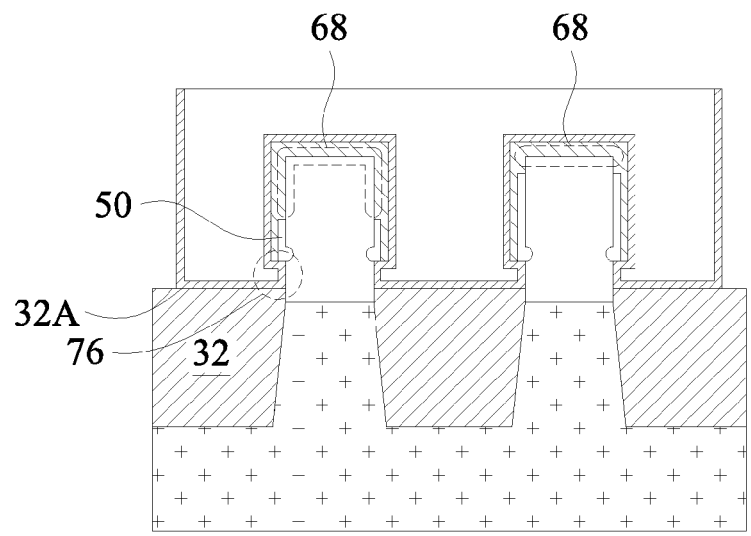

FIGS. 15B and 15C illustrate cross-sectional views of FinFETs with partial height strain buffer layers 50 according to some embodiments. Partial height strain buffers 50 are formed, for example, as shown in FIGS. 9B and 9C. The strain buffer layers 50 are spaced apart from the top surface 32A of the STI regions 32 by the lower channel gate region 76.

In some embodiments, the strain buffers 50 are created by oxidizing a portion of the interface between the semiconductor region 46 and the fin 44. The oxidation is determined by, for example, controlling the penetration of an oxygen plasma through the semiconductor region 46, by reducing oxidation time, by varying the thickness of the semiconductor region 46, or another process. In some embodiments, as shown in FIG. 15B, the strain buffer layer 50 has an opening on the top surface of the fin 44, with an interface contact region 68 where the semiconductor region 46 contacts the fin 44 disposed between upper strain buffer layer portions 50B. In other embodiments, as shown in FIG. 15C, the strain buffer layer extend partially up the sidewall of the fin 44, with the interface contact region 68 on the top of the fin 44 and extending over the fin 44 to the sidewalls of the fin 44. Additionally, as shown in FIG. 15C, different fins 44 have, in some embodiments, strain buffer layers 50 extending to different heights along the sidewalls, or over the fin 44, permitting tuning of device performance.

Figure 16A:
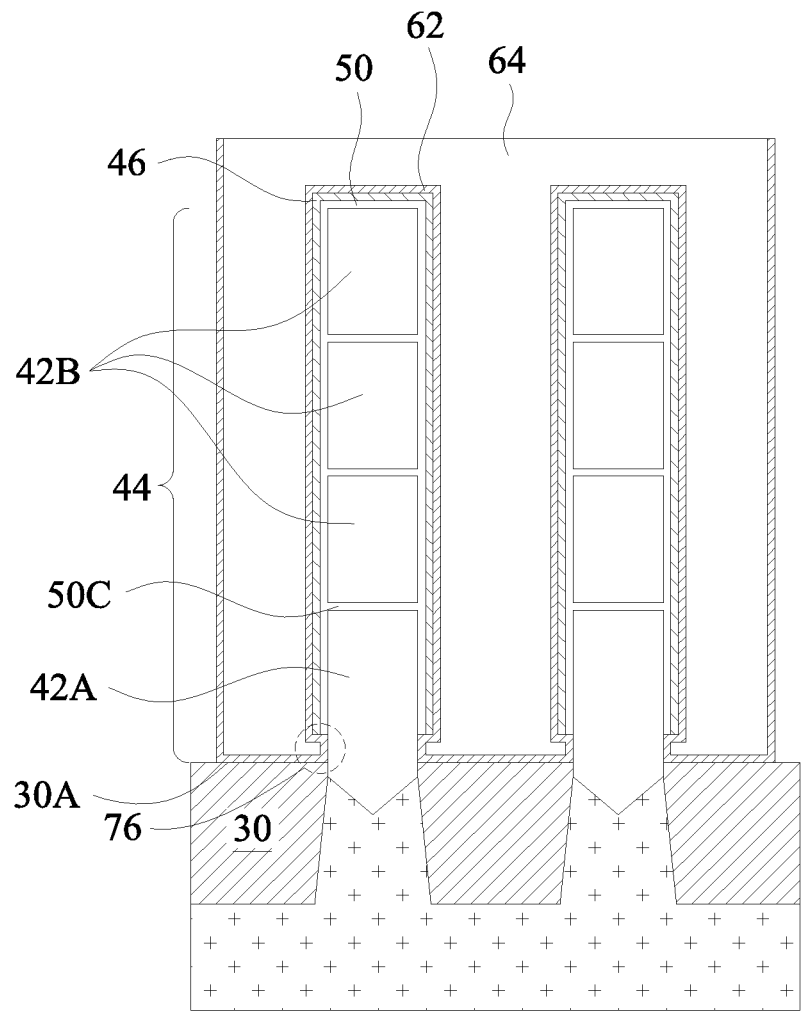
FIGS. 16A through 16C are cross-sectional views of FinFETs with multiple raised strain buffer layers in accordance with various embodiments.

FIG. 16A is a cross-sectional view illustrating a FinFET with multiple raised strain buffer layer regions 50C according to an embodiment. A fin 44 comprises a lower semiconductor region 42A and one or more upper semiconductor regions 42B. The lower semiconductor region 42 and upper semiconductor regions 42B are separated by strain buffer layer regions 50C extending laterally between the semiconductor regions 42A and 42B, electrically insulating each semiconductor region 42A and 42B to create separate channels.

In some embodiments, the lower semiconductor region 42A is formed as described above with respect to FIG. 1 through 7. After forming the lower semiconductor region 42A, a portion of semiconductor region 46 is formed by depositing or otherwise forming a layer of semiconductor material over the top surface of the lower semiconductor region 42A. In some embodiments, the semiconductor region 46 is formed over the lower semiconductor region 42A as described above with respect to FIG. 8.

An upper semiconductor region 42B is formed over the top surface of the semiconductor region 46. In some embodiments, the upper semiconductor region 42B is formed from the same material as the lower semiconductor region 42A, and is formed, for example, through epitaxial growth, through CVD, PVD, PECD or another process. In some embodiments, a portion of semiconductor region 46 separates the upper semiconductor region 42B from the lower semiconductor region 42A.

Additional upper semiconductor regions 42B are formed with portions of semiconductor region 46 formed therebetween. The semiconductor region 46 is oxidized, as described above with respect to FIG. 9A, to form the strain buffer layer 50. Portions of the semiconductor region 46 disposed between the lower semiconductor material 42A and upper semiconductor material 42B form lateral strain buffer layer portions 50C after oxidation. The strain buffer layer 50 is separated from the top surface 30A of the STI regions 30 by the lower channel gate region 76, with a portion of the gate dielectric 62 and gate electrode 64 extending under the strain buffer layer 50. In some embodiments, the semiconductor region 46 forms an upper channel and the lower semiconductor region 42A and upper semiconductor regions 42B form multiple lower channels, which are all tied to a common source and drain 66.

Figure 16B:
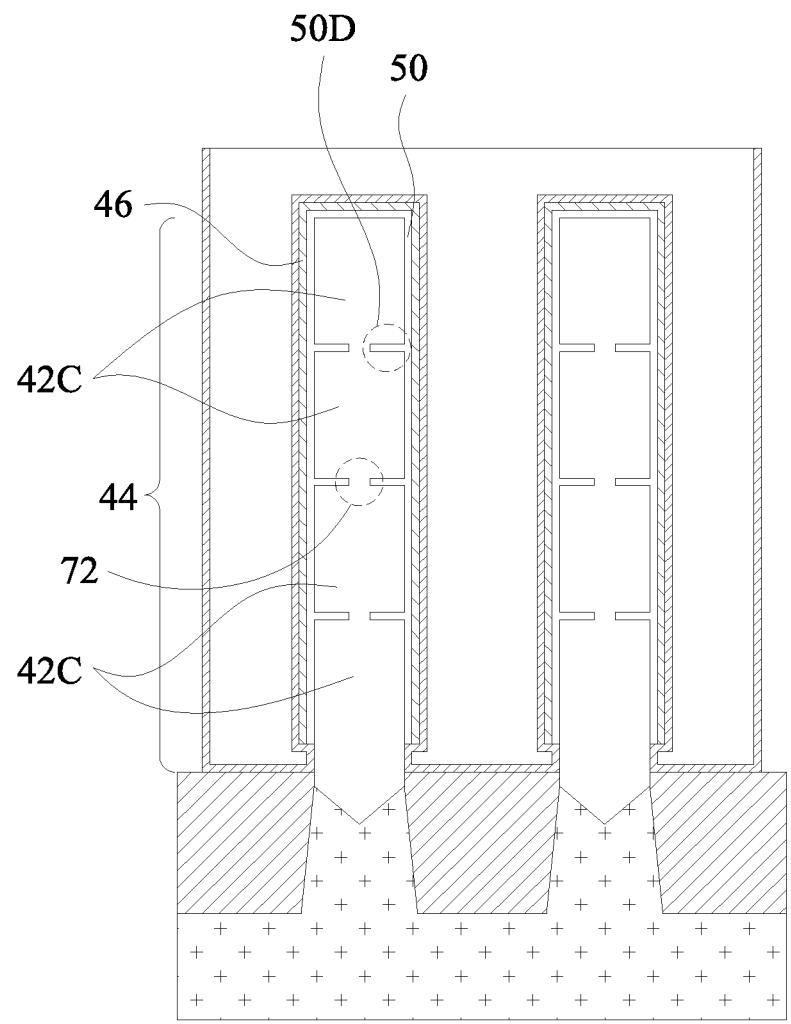

FIG. 16B is a cross-sectional view illustrating a FinFET with raised strain buffer layers according to an embodiment. In such an embodiment, a fin 44 has multiple semiconductor region portions 42C that are connected by contact regions 72. Strain buffer layer portions 50D extend into recesses in the sidewalls of the fin 44 between semiconductor regions 42C and are separated by the contact regions 72. In some embodiments, the semiconductor regions 42C are formed in stages, with semiconductor region 46 being formed over each semiconductor region portion 42C prior to formation of subsequent semiconductor region portions 42C. The semiconductor region 46 is oxidized as described above, resulting in strain buffer layer 50 with strain buffer layer portions 50D that extend partially between the semiconductor region portions 42C. The strain buffer layer 50 is separated from the top surface 30A of the STI regions 30 by the lower channel gate region 76, with a portion of the gate dielectric 62 and gate electrode 64 extending under the strain buffer layer 50.

Figure 16C:
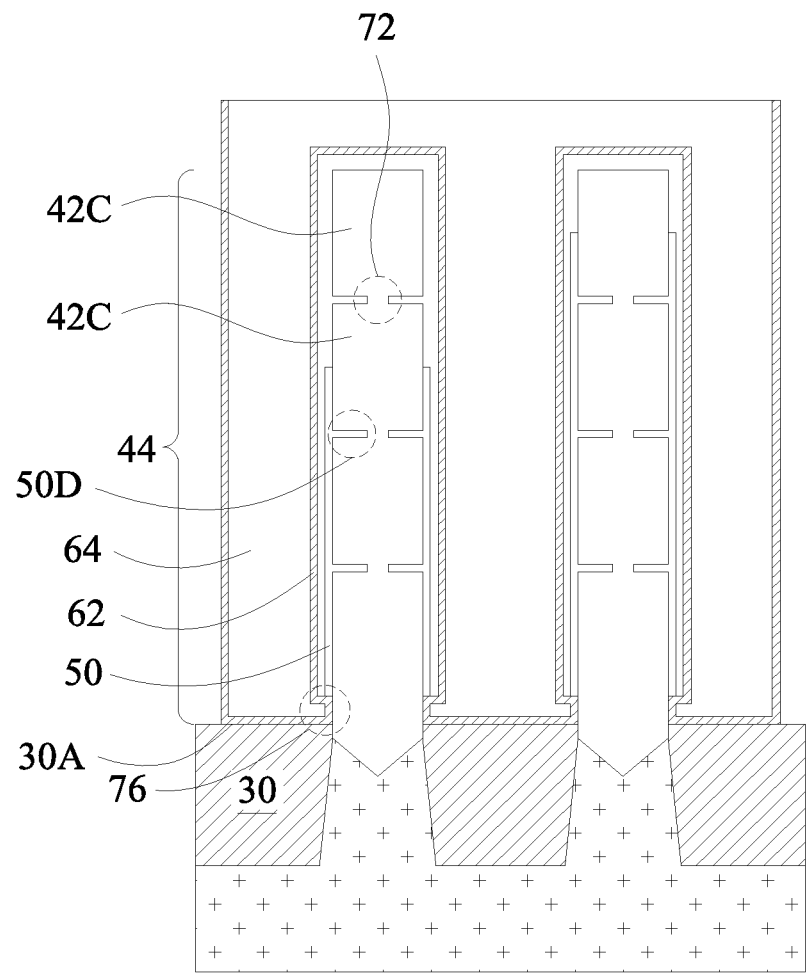

FIG. 16C is a cross-sectional view illustrating a FinFET with partial height raised strain buffer layers. In such an embodiment, a fin having multiple semiconductor regions 42C connected by contact regions 72 has a strain buffer layer 50 that extends partially up the sidewalls of the fin 42. The strain buffer layer 50 is separated from the top surface 30A of the STI regions 30 by the lower channel gate region 76, with a portion of the gate dielectric 62 and gate electrode 64 extending under the strain buffer layer 50. Strain buffer layer portions 50D extend between semiconductor regions 42C and are separated by the contact regions 72. Different fins 44 have, in some embodiments, strain buffer layers 50 extending to different heights along the sidewalls of the fin 44, permitting tuning of device performance.

Figure 17A:
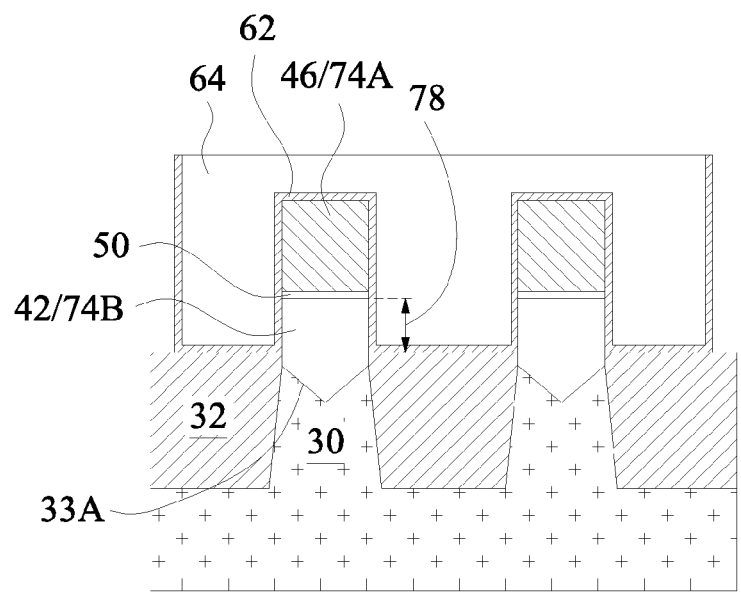
FIGS. 17A through 17B are cross-sectional views of FinFETs with lateral raised strain buffer layers in accordance with various embodiments.
Figure 17B:
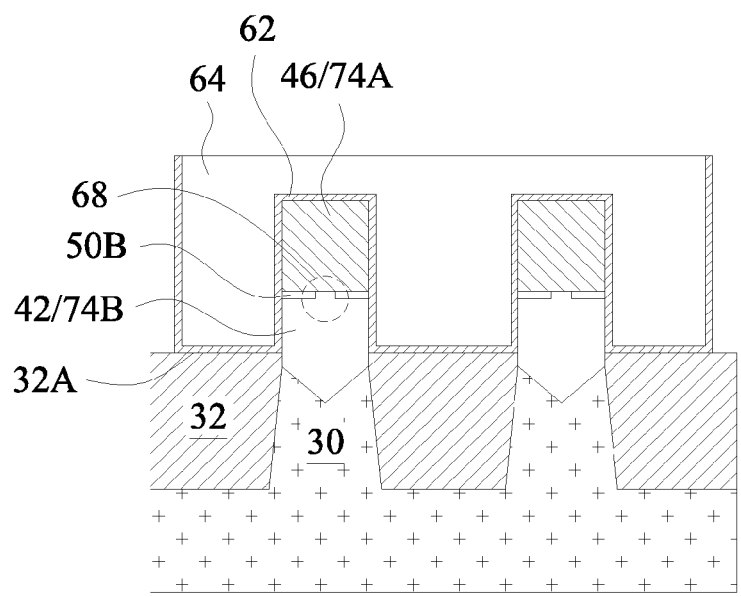

FIGS. 17A and 17B illustrate cross-sectional view of Fin-FETs with upper and lower channel regions 74A and 74B separated by a strain buffer layer 50 in accordance with some embodiments. Semiconductor region 30 is formed over the semiconductor fins 30 as described above. Semiconductor region 46 is formed over semiconductor region 42, and the strain buffer layer 50 is formed by oxidizing the interface between the semiconductor regions 42 and 46. Semiconductor region 42 acts as the upper channel 74A, and semiconductor region 42 acts as the lower channel 74B. Semiconductor region 42 has sidewalls exposed over the top surface 32A of the STI regions 32, permitting the gate dielectric 62 and gate electrode 64 to be immediately adjacent to semiconductor region 42, permitting the gate electrode 64 to control the upper channel 74A and lower channel 74B.

FIG. 17A illustrates a strain buffer layer 50 extending all way across the interface between the semiconductor regions 42 and 46, while FIG. 17B illustrates partial strain buffer layer, with strain buffer portions 50B separated by an interface contact region 68. The strain buffer portions 50B are created by oxidizing a portion of the interface as described above.

In accordance with some embodiments, a device includes a substrate, insulation regions extending into the substrate, and a semiconductor fin higher than top surfaces of the insulation regions. The semiconductor fin has a first lattice constant. A semiconductor region includes sidewall portions on opposite sides of the semiconductor fin, and a top portion over the semiconductor fin. The semiconductor region has a second lattice constant different from the first lattice constant. A strain buffer layer is between and contacting the semiconductor fin and the semiconductor region. The strain buffer layer includes an oxide.

In accordance with other embodiments, a device includes a first semiconductor region, wherein the first semiconductor region has a first lattice constant, and a second semiconductor region over the first semiconductor region. The second semiconductor region has a second lattice constant different from the first lattice constant. A strain buffer layer is between and contacting the first semiconductor region and the second semiconductor region, wherein the strain buffer layer includes an oxide of the first semiconductor region and an oxide of the second semiconductor region. A gate dielectric is overlying the second semiconductor region. A gate electrode is overlying the first semiconductor region.

In accordance with yet other embodiments, a method includes performing an epitaxy to grow a first semiconductor region on a second semiconductor region, wherein the first semiconductor region has a first lattice constant different from a second lattice constant of the second semiconductor region. The method further includes performing an oxidation process to form an oxide in an interface region between the first semiconductor region and the second semiconductor region. In the oxidation process, portions of the first semiconductor region and the second semiconductor region in an interface region between the first semiconductor region and the second semiconductor region are oxidized to form an oxide region. A portion of the first semiconductor region remains after the oxidation process, and is separated from the second semiconductor region by the oxide region.

According to an embodiment, a device comprises insulation regions disposed in a substrate and a semiconductor fin extending above top surfaces of the insulation regions. The semiconductor fin comprises a first material. A semiconductor region comprising a second material extends from a first side of the semiconductor fin over a top of the fin to a second side of the fin. A strain buffer layer is disposed between, and contacts, the semiconductor fin and the semiconductor region. The strain buffer layer comprises an oxide, and a bottommost surface of the strain buffer layer is vertically spaced apart from the top surfaces of the insulation regions.

According to another embodiment, a device comprises a first semiconductor region disposed between isolation regions in a substrate. The first semiconductor region has a first lattice constant. A second semiconductor region is disposed over the first semiconductor region. The second semiconductor region has a second lattice constant different from the first lattice constant. A strain buffer layer is interposed between the first semiconductor region and the second semiconductor region, with the strain buffer layer is spaced apart from top surfaces of the isolation regions. The strain buffer layer comprises an oxide, the oxide comprising a first material of the first semiconductor region and a second material of the second semiconductor region. A gate dielectric overlies the first semiconductor region and the second semiconductor region and the gate dielectric contacts at least sidewalls of the first semiconductor region. A gate electrode overlies the first semiconductor region and the second semiconductor region.

A method according to an embodiment comprises providing a substrate having isolation regions disposed therein and a first semiconductor region disposed between the isolation regions. A second semiconductor region is formed on the first semiconductor region with an epitaxial process. The first semiconductor region has a first lattice constant different from a second lattice constant of the second semiconductor region. An oxidation process is performed to form an oxide in an interface region between the first semiconductor region and the second semiconductor region. Top surfaces of the isolation regions are reduced and sidewalls of the first semiconductor region are exposed. A gate stack is formed over the first semiconductor region and the second semiconductor region, the gate stack comprising a gate dielectric extending under the strain buffer layer to the exposed sidewalls of the first semiconductor region.

Although the embodiments and their advantages have been described in detail, it should be understood that various changes, substitutions and alterations can be made herein without departing from the spirit and scope of the embodiments as defined by the appended claims. Moreover, the scope of the present application is not intended to be limited to the particular embodiments of the process, machine, manufacture, and composition of matter, means, methods and steps described in the specification. As one of ordinary skill in the art will readily appreciate from the disclosure, processes, machines, manufacture, compositions of matter, means, methods, or steps, presently existing or later to be developed, that perform substantially the same function or achieve substantially the same result as the corresponding embodiments described herein may be utilized according to the disclosure. Accordingly, the appended claims are intended to include within their scope such processes, machines, manufacture, compositions of matter, means, methods, or steps. In addition, each claim constitutes a separate embodiment, and the combination of various claims and embodiments are within the scope of the disclosure.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A device comprising:
   insulation regions disposed in a substrate;
   a semiconductor fin extending above top surfaces of the insulation regions, wherein the semiconductor fin comprises a first material;
   a semiconductor region comprising a second material, wherein the semiconductor region extends from a first side of the semiconductor fin over a top of the fin to a second side of the fin;
   a strain buffer layer between and contacting the semiconductor fin and the semiconductor region, wherein the strain buffer layer comprises an oxide, and wherein a bottommost surface of the strain buffer layer is vertically spaced apart from the top surfaces of the insulation regions; and
   a gate electrode extending over the semiconductor region, the gate electrode having a lower region that extends interjacent the semiconductor region and the insulation regions.

2. The device of claim 1, wherein the first material has a first lattice constant and wherein the second material has a second lattice constant different from the first lattice constant.

3. The device of claim 1, wherein the first material has a material composition different from material composition of a third material of the substrate.

4. The device of claim 1, further comprising a gate dielectric and a gate electrode extending from the first side of the fin over the fin to a second side of the fin, wherein a portion of the gate dielectric extends between the bottommost surface of the strain buffer layer and the top surface of one of the insulation regions.

5. The device of claim 1, wherein at least a portion of the top surface of the semiconductor fin extends through a gap in the strain buffer layer.

6. The device of claim 1, wherein the strain buffer layer extends into recesses in sidewalls of the semiconductor fin.

7. The device of claim 1, wherein the strain buffer layer fully separates sidewall portions of the semiconductor region from sidewalls of the semiconductor fin.

8. The device of claim 1, wherein the semiconductor region forms an upper channel, wherein the semiconductor fin forms a lower channel, and wherein the upper channel and the lower channel are disposed between a common source and drain.

9. The device of claim 8, wherein a height of the upper channel is equal to or greater than a height of the lower channel.

10. A device comprising:
    a first semiconductor region disposed between isolation regions in a substrate, wherein the first semiconductor region has a first lattice constant;
    a second semiconductor region over the first semiconductor region, wherein the second semiconductor region has a second lattice constant different from the first lattice constant;
    a strain buffer layer interposed between the first semiconductor region and the second semiconductor region, wherein the strain buffer layer is spaced apart from top surfaces of the isolation regions, wherein the strain buffer layer comprises an oxide, the oxide comprising a first material of the first semiconductor region and a second material of the second semiconductor region;
    a gate dielectric overlying the first semiconductor region and the second semiconductor region, wherein the gate dielectric contacts at least sidewalls of the first semiconductor region; and
    a gate electrode overlying the first semiconductor region and the second semiconductor region.

11. The device of claim 10, wherein the strain buffer layer fully separates the first semiconductor region from the second semiconductor region.

12. The device of claim 11, wherein a bottommost surface of the second semiconductor region is disposed over a topmost surface of the strain buffer layer.

13. The device of claim 10, wherein the second semiconductor region is disposed over a top surface of the strain buffer layer, and wherein the second semiconductor region contacts the first semiconductor region through an opening in the strain buffer layer.

14. The device of claim 10, wherein the strain buffer layer has portions disposed on the sidewalls of the first semiconductor region, and wherein a portion of the gate dielectric extends between a bottommost surface of the strain buffer layer and the topmost surface of one of the isolation regions.

15. The device of claim 14, wherein the strain buffer layer extends into recesses in the sidewalls of the first semiconductor region.

16. The device of claim 14, wherein the first semiconductor region comprises two or more portions that are vertically spaced apart and separated by a portion of the strain buffer layer.

17. The device of claim 10, wherein the first semiconductor region forms a lower channel having a first height, wherein the second semiconductor region forms an upper channel having a second height that is equal to or greater than the first height, and wherein the upper channel and the lower channel are disposed between a common source and drain.

18. A method comprising:
    providing a substrate having isolation regions disposed therein and a first semiconductor region disposed between the isolation regions;
    forming a second semiconductor region on the first semiconductor region with an epitaxial process, wherein the first semiconductor region has a first lattice constant different from a second lattice constant of the second semiconductor region;
    performing an oxidation process to form a strain buffer layer in an interface region between the first semiconductor region and the second semiconductor region, wherein the strain buffer layer is an oxide;
    reducing top surfaces of the isolation regions and exposing sidewalls of the first semiconductor region; and
    forming a gate stack over the first semiconductor region and the second semiconductor region, the gate stack comprising a gate dielectric extending under the strain buffer layer to the exposed sidewalls of the first semiconductor region.

19. The method of claim 18, wherein the oxidation process comprises annealing in an oxygen-containing environment.

20. The method of claim 18, wherein the oxidation process comprises oxidizing with an oxygen-containing plasma.

* * * * *